United States Patent
Jang et al.

(10) Patent No.: US 9,680,000 B2
(45) Date of Patent: Jun. 13, 2017

(54) TERAHERTZ RADIATING DEVICE AND FABRICATING METHOD FOR THE SAME

(71) Applicant: GWANGJU INSTITUTE OF SCIENCE AND TECHNOLOGY, Gwangju (KR)

(72) Inventors: Jae-Hyung Jang, Gwangju (KR); Sung-Min Hong, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/958,861

(22) Filed: Dec. 3, 2015

(65) Prior Publication Data
US 2016/0163915 A1   Jun. 9, 2016

(30) Foreign Application Priority Data
Dec. 8, 2014 (KR) .......... 10-2014-0174700

(51) Int. Cl.
| | | |
|---|---|---|
| H01L 29/778 | (2006.01) | |
| H01S 5/343 | (2006.01) | |
| H01L 29/417 | (2006.01) | |
| H01L 29/20 | (2006.01) | |

(52) U.S. Cl.
CPC ...... *H01L 29/7786* (2013.01); *H01L 29/7784* (2013.01); *H01S 5/343* (2013.01); *H01L 29/2003* (2013.01); *H01L 29/41725* (2013.01)

(58) Field of Classification Search
CPC ............ H01L 29/7786; H01L 29/7789; H01L 29/7784; H01L 29/2003; H01L 29/41725; H01S 5/343
See application file for complete search history.

(56) References Cited

U.S. PATENT DOCUMENTS

| | | | | |
|---|---|---|---|---|
| 5,914,497 | A | * 6/1999 | Sherwin | ........ B82Y 20/00 257/194 |
| 8,304,812 | B2 | 11/2012 | Onishi et al. | |
| 2015/0364508 | A1 | * 12/2015 | Le Bars | ........ H01L 31/18 250/338.4 |

OTHER PUBLICATIONS

[Supportive Materials for Exception to Loss of Novelty] Hong et al., "Investigation of the THz Resonant Oscillation in HEMTs by Solving the Pseudo-2D Poisson Equation and the 1D Transport Equation", Published at the 21st Korean Conference on Semiconductors dated Feb. 25, 2014, 5 pages, Seoul, Korea.

\* cited by examiner

*Primary Examiner* — Tucker J Wright
(74) *Attorney, Agent, or Firm* — Hauptman Ham, LLP

(57) ABSTRACT

The present invention relates to a terahertz radiating device, which includes a high electron mobility transistor (HEMT); a source provide to the HEMT; a gate right to the HEMT; a drain provide to the HEMT; a first antenna connected with the drain; a drain bias for applying a direct current (DC) voltage to the drain; and a source-gate connector for connecting the source and the gate in a device unit. Thereby, commercially available terahertz waves may be radiated, and high output power may be obtained.

15 Claims, 20 Drawing Sheets

TERAHERTZ RADIATING DEVICE AND FABRICATING METHOD FOR THE SAME

CROSS-REFERENCE TO RELATED APPLICATIONS

This application claims the benefit of Korean Patent Application No. 10-2014-0174700, filed on Dec. 8, 2014, entitled "TERAHERTZ RADIATING DEVICE AND FABRICATING METHOD FOR THE SAME", which is hereby incorporated by reference in its entirety into this application.

BACKGROUND

1. Technical Field

The present invention relates to a terahertz radiating device and a method for fabricating the same. More particularly, the present invention relates to a terahertz radiating device capable of providing an electromagnetic wave signal source of a terahertz band using a transistor and a method for fabricating the same.

2. Description of the Related Art

The terahertz band is arranged between the RF band, microwave band and millimeter wave band, in which electronics technology is applied, and the frequency band of light in which photonics technology is applied. Research has been actively conducted on technology for generating/controlling/detecting electromagnetic waves of the terahertz as this technology is expected to be used for medical diagnostic technology, national security and short-range wireless communication employing extremely high frequencies.

However, the terahertz band, which is called the terahertz gap, still remains an unexplored area since it is not easy to apply the electronics technology and the photonics technology in the terahertz band.

In particular, the potential of the terahertz band has not been fully harnessed due to technical challenges of unit device technology for implementing a terahertz system. Specifically, signal source device technology for generating electromagnetic waves in the terahertz band is the biggest challenge. Challenges to be addressed to harness the full potential of the terahertz band includes not only generating electromagnetic waves in the terahertz band but also enabling a signal source device to operate at room temperature rather than at an extremely low temperature, enabling the device to operate at low voltage rather than at high voltage, designing a compact and lightweight device, and implementing electrical control of the device. Signal source devices of the terahertz band that have been introduced include a photoconductive antenna, quantum cascade lasers, a resonant tunneling diode, and an optical rectification device (the term "device" or "radiating device", as used herein, preferably refers to a signal source device for the terahertz band). However, none of the aforementioned devices have met the requirements listed above.

Under these circumstances, plasma wave transistor technology has been introduced, which is a kind of signal source device technology for causing oscillation in the terahertz band based on instability of plasma in the two-dimensional electromagnetic field in a transistor. This technology employs gradual amplification of the plasma mode in the two-dimensional electromagnetic field which occurs when electrical boundary conditions are unequally applied to the source electrode (hereinafter, referred to as source) and drain electrode (hereafter, referred to as drain) of the transistor. Once the plasma mode reaches a certain magnitude through amplification, the amplified plasma mode remains in steady state in the transistor channel without increase in amplitude. In addition, the transfer speed of plasma is greater than or equal to 10 times the speed of an electron in the two-dimensional electromagnetic field, and accordingly the plasma mode enables operation in the terahertz band, overcoming the limit of the switching speed that depends on conventional electron transport.

Electromagnetic radiation using the plasma wave transistor technology in the terahertz band has been experimentally observed in a high electron mobility transistor (HEMT) employing compounds in Groups III-V at a low temperature and room temperature. The output power of electromagnetic waves achieved in the terahertz band with this configuration is only in the range of microwatts. The output power is one of the most important performance indicators for signal source devices. Herein, it should be noted that efficient transmission of energy stored in the plasma mode formed in the signal source device is important and a ratio of the power of an electromagnetic wave generated in the terahertz band to the utilized power depends on efficiency of the applied transmission technique.

As described above, the plasma wave transistor technology based on plasma instability utilizes non-uniformity of electrical boundary conditions of the source and drain of a transistor. Particularly, when the drain is electrically shorted in a high-frequency region, oscillation occurs easily. In this case, oscillation of a drain voltage is observed but outputting power through the drain is not possible. Accordingly, research has been conventionally conducted on outputting power through the gate electrode (hereinafter, referred to as gate) rather than through the drain.

For example, efforts have been made to fabricate a gate in a grating structure to efficiently convert the plasma mode in the transistor channel to an electromagnetic wave. A typical example is disclosed in U.S. Pat. No. 8,304,812 ("Terahertz wave radiating element") granted to Panasonic Corporation. However, the output power of electromagnetic wave radiation obtained in the terahertz band according to the aforementioned patent document is insubstantial. It is thought that this is because combination between the gate electrode fabricated in the grating structure and the plasma mode is not sufficiently strong.

BRIEF SUMMARY

It is an aspect of the present invention to provide a terahertz radiating device capable of operating with low power at room temperature, achieving a compact and lightweight design and electrical controllability and obtaining high output power, and a method for fabricating the same.

In accordance with one aspect of the present invention, a terahertz radiating device includes: a high electron mobility transistor (HEMT); a source provide to the HEMT; a gate right to the HEMT; a drain provide to the HEMT; a first antenna connected with the drain; a drain bias for applying a direct current (DC) voltage to the drain; and a source-gate connector for connecting the source and the gate in a device unit. Thereby, commercially available terahertz waves may be radiated from the transistor.

The source-gate connector may extend in a direction perpendicular to a longitudinal direction of the gate, the gate extending in one direction, and the gate and the source may be connected to each other at a shortest distance by the source-get the connector. The gate and the source may be alternating current (AC)-shorted by the source-gate connector, the source-gate connector may be formed such that no parasitic component is present between the gate and the source, and the source-gate connector may be formed together with a ground.

The HEMT may include a substrate, and a channel layer provided on a upper side of the substrate, wherein the channel layer may have a heterojunction structure formed of a selected one of InGaAs/InAs, AlGaN/GaN, InAlN/AlN/GaN, AlGaAs/GaAs and AlGaAs/InGaAs. The channel layer may include: a first channel formed of $In_{0.53}GaAs_{0.47}$ with a thickness less than or equal 5 nm; a sub-channel provided on an upper side of the first channel and formed of InAs with a thickness less than or equal to 3 nm; and a second channel provided on an upper side of the sub-channel and formed of $In_{0.75}Ga_{0.25}As$ with a thickness less than or equal to 7 nm. The terahertz radiating device may further include a spacer provided on the channel layer; a delta-doped layer provided on the spacer; and a Schottky layer provided on an upper side of the delta-doped layer. Herein, the terahertz radiating device may further include an etch stop layer; and a cap layer, wherein the etch stop layer and the cap layer may be provided on the Schottky layer. The substrate may be formed of a selected one of InP, sapphaire and SiC, and the terahertz radiating device may further include a metal layer provided to a lower surface of the substrate.

The terahertz radiating device may further include a second antenna connected to the source; and a source bias for applying a DC voltage to the source.

When the terahertz radiating device includes the first antenna and/or the second antenna, the bias may include a high impedance line having a high impedance. The high impedance line may be formed in a shape of a line having a narrow width, the line being a straight line or a curved line, and the antenna may be provided in a shape of a straight line or a radial stub. The antenna may have a symmetrical structure with respect to a travel direction of a plasma wave, and the high impedance line extends in a direction perpendicular to a travel direction of a plasma wave. The high impedance line may be connected to a center of the antenna. The high impedance line may be connected to a position adjacent to the drain. The first antenna and the second antenna may extend in the same direction or in different directions.

When the terahertz radiating device includes the first antenna and/or the second antenna, a length of the antenna may be $\lambda_{eff}/4$, wherein $\lambda_{eff}/4$ may be an effective wavelength of a radiated terahertz wave calculated in consideration of a substrate. The bias may include a high impedance line having a length of $\lambda_{eff}/4$, wherein $\lambda_{eff}/4$ may be an effective wavelength of a radiated terahertz wave calculated in consideration of a substrate.

In accordance with another aspect of the present invention, a method for fabricating the terahertz radiating device includes performing a film formation operation of providing a high electron mobility transistor (HEMT); providing a source and a drain; providing a gate; connecting the gate and the source in a device unit; and performing a post-processing operation.

The method may further include performing a gate recess operation, wherein the gate recess operation may be performed before the providing of the gate. Herein, a heterojunction structure of the HEMT may include InGaAs/InAs, and InP may be used for a substrate. The gate may make a Schottky contact with the HEMT. The providing of the gate may include providing Ti/Pt/Au or Pt/Ti/Pt/Au multilayer mental.

A heterojunction structure of the HEMT may include InAlN/GaN, InGaAlN/GaN, or AlGaN/GaN, and SiC or sapphire is used for a substrate. The providing of the source and the drain may include depositing an ohmic contact material in a multilayer structure of Ti/Al/Ni/Au or Mo/Al/Mo/Au and performing thermal treatment at a temperature between 600° C. and 950° C.

According to embodiments of the present invention, a commercially available terahertz radiating device may be provided. Particularly, the terahertz radiating device may obtain high output power.

DETAILED DESCRIPTION

Hereinafter, embodiments of the present invention will be described in detail with reference to the accompanying drawings. It should be understood that the present invention is not limited to the following embodiments, and that the embodiments are provided for illustrative purposes only. The scope of the invention should be defined only by the accompanying claims and equivalents thereof.

<Embodiment 1>

Figure 1:
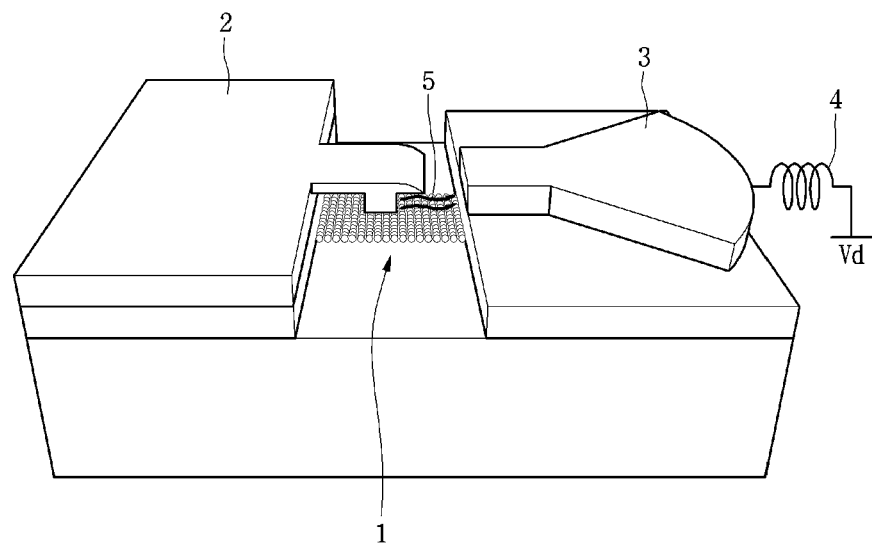
FIG. 1 is a conceptual perspective view illustrating a terahertz radiating device according to a first embodiment.

FIG. 1 is a conceptual perspective view illustrating a terahertz radiating device according to a first embodiment.

Referring to FIG. 1, the terahertz radiating device according to the first embodiment forms a two-dimensional electron cloud using a high electron mobility transistor (HEMT) and forms a gate, source, and drain on the HEMT to enable radiation of electromagnetic waves in the terahertz band. Herein, the HEMT is a device for accelerating electrons using heterojunction. Specifically, the HEMT joins materials of different energy bands and provides a well between the materials to trap an electron therein to separate a doped surface from a channel layer. Thereby, electron mobility increases significantly and thus the electron is caused to move fast. The terahertz radiating device includes an HEMT 1, a gate 6, source 5 and drain 7, which are provided to the HEMT 1, a ground 2 connecting the source and the drain in a device unit, a monopole antenna 3 connected at least to the drain, and a bias 4 for applying a DC voltage to the monopole antenna 3. When the terahertz radiating device described above operates, terahertz vibration 5 may be generated as shown in the figure.

Figure 2:
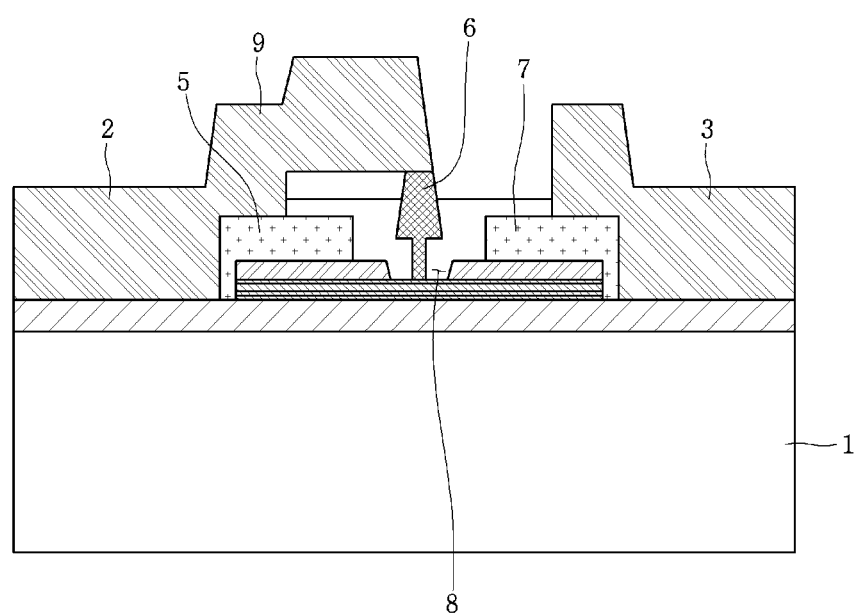
FIG. 2 is a cross-sectional view of the terahertz radiating device according to the first embodiment.

FIG. 2 is a cross-sectional view of the terahertz radiating device according to the first embodiment.

Referring to FIG. 2, the terahertz radiating device includes the HEMT 1, and the source 5, gate 6 and drain 7, which are provided at proper places on the HEMT 1. The source 5 and the gate 6 are connected together to the ground 2 in a device unit. To this end, a source-gate connector 9 extends in a direction to connect the gate with the source as a part of the ground 2. The monopole antenna 3 may be connected to the drain 3 to perform terahertz radiation. The upper surface of the HEMT is provided with a gate recess 8, and the gate 6 is placed in the recess region. The frequency of terahertz radiation may be determined by the structure of the gate recess 8.

Herein, the term "device unit" may be interpreted as meaning that the source 5 and the gate 6 are connected to each other by a component constituting a semiconductor device in a process for performing a semiconductor process provided to the HEMT. In other words, this term may be conceptually opposite to connection between the source 5 and the gate 6 through wire connection of an external circuit outside the device. If the source and the gate of the terahertz radiating device according to this embodiment are connected to each other in an external connection manner rather than being connected in a device unit, terahertz radiation is weakened or obstructed by, for example, parasitic capacitance of the external connection. The source and the gate may be connected at the shortest distance in order to allow a terahertz signal to be easily transferred to the drain via the source and the gate. The source-gate connector 9 may extend in a direction crossing the longitudinal direction of the gate, more preferably, in a direction perpendicular to the longitudinal direction of the gate to directly connect the source and the gate.

Hereinafter, necessity of the source-gate connector 9 will be described in more detail. When a plasma wave of terahertz oscillating through the drain 7 provided to the HEMT travels, the same amount of current needs to flow toward the source electrode. To this end, the gate and the source are preferably connected to each other using the source-gate connector 9. In addition, the source-gate connector 9, which serves as the path of the aforementioned current, should be formed such that the gate 6 is linearly connected with the source 5 at the shortest distance. Otherwise, the plasma wave may be affected by a parasitic component on the connection line. In other words, boundary conditions for the source and the drain may be strictly implemented such that the aforementioned mode cannot be correctly implemented if there is any change in the boundary conditions. The boundary conditions will be described in detail later in this specification.

Hereinafter, a detailed description will be given of a mechanism for generating a plasma wave according to an embodiment. A very thin electron layer in a nanometer unit is formed on a heterojunction surface in the depth direction of the HEMT 1. The electrical layer cannot move in the depth direction, but is allowed to move only in a two-dimensional plane perpendicular to the depth direction. For this reason, the electron layer is called a two-dimensional electron gas (or electron cloud). An AC signal having a high-frequency component corresponding to terahertz may be generated in the two-dimensional electron gas.

Hereinafter, description will be given of a wave mode which the two-dimensional electron gas may have. Equations for unique modes which may present in the two-dimensional electron gas for a desired frequency value include an equation for transport of electrons and an equation for an electric field in the HEMT. These equations yield a certain phase velocity in the wave mode. The phase velocity has an order of about $10^8$ cm/sec, which is greater than the moving speed of electrons (an order of about $10^7$ cm/sec at room temperature) in the two-dimensional electron gas. Accordingly, when a signal is sent in this mode, a corresponding operation may be performed faster than with a typical electronic device by.

In the wave mode, the speed in the direction from the source to the drain is the same as the speed in the direction from the drain to the source when a direct current does not flow. However, if electrons move either to the source or to the drain as a direct current is applied to the channel, the same speed is not ensured anymore. In other words, the speed of movement from the source to the drain in the wave mode increases, while the speed of movement from the drain to the source in the wave mode decreases.

If an AC short condition and an AC open condition are established for the source and the drain respectively when the speeds of the two modes of movement in both directions are different from each other, the degree of the mode generated in the two-dimensional electron gas gradually increases over time. However, if there is any change in the boundary condition for the source and the gate, the mode may not be correctly implemented.

To strictly implement the boundary condition, the source-gate connector 9 connects the source 5 and the gate 6 in a device unit. As will be described below, in order to provide the boundary condition more strictly, the source-gate connector 9 extends in a direction perpendicular to the longitudinal direction of the gate 6, which extends in one direction. To strictly implement the boundary condition, the source-gate connector 9 connects the source 5 with the gate 6 in a device unit. Accordingly, the AC short condition may be implemented without any parasitic component.

Figure 3:
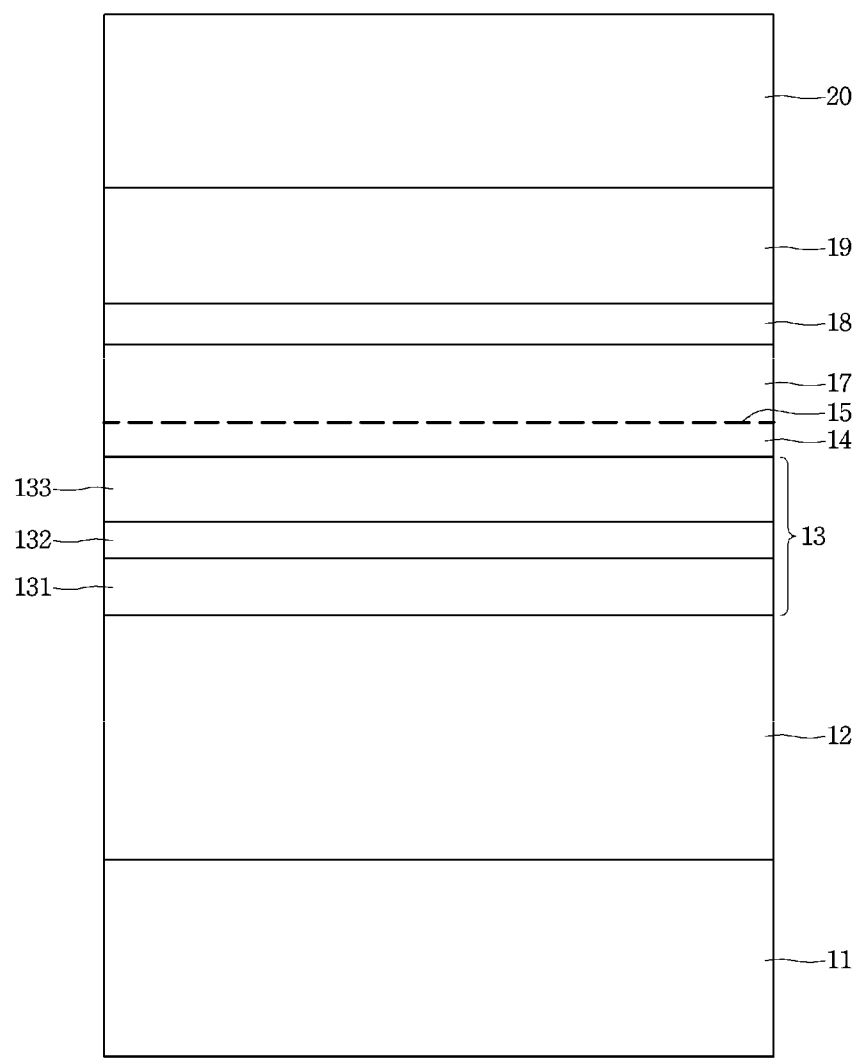
FIG. 3 shows a film formation structure of an HEMT applicable to the first embodiment.
Figure 4:
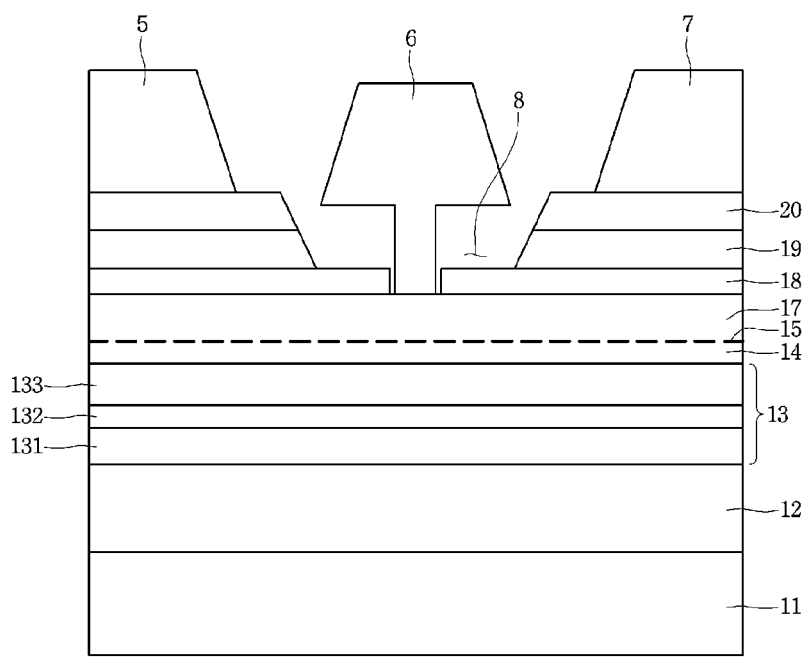
FIG. 4 is an enlarged view illustrating configuration including an HEMT applicable to the first embodiment.

FIG. 3 shows a film formation structure of an HEMT applicable to the first embodiment, and FIG. 4 is an enlarged view illustrating configuration including an HEMT applicable to the first embodiment.

Referring to FIGS. 3 and 4, the film formation structure includes a substrate 11 formed of, for example, InP, a buffer layer 12 formed of, for example, InAlAs with a thickness of 500 nm and provided on the substrate 11 to reduce crystal defects, a channel layer 13 provided on the buffer layer 12 to provide the two-dimensional electron gas, a spacer 14 provided to adjust the distance between the gate 6 and the channel layer 13 and formed of, for example, InAlAs with a thickness between 3 nm and 5 nm, a delta-doped layer 15 for δ-doping of $2\text{-}4\times10^{12}/cm^2$ provided on the spacer 14, a Schottky layer 17 provided on the delta-doped layer 15 for connection of the gate 6 and formed of, for example, InAlAs with a thickness between 4 nm and 9 nm, an etch stop layer 18 for controlling etching in the fabrication operation and formed of, for example, InP with a thickness between 2 nm and 5 nm, and a first cap layer 19 and second cap layer 20 provided on the etch stop layer to protect the layers arranged below the cap layers. The first cap layer 19 is formed of, for example, $n^+$InAlAs with a thickness between 2 nm and 5 nm, and the second cap layer 20 is formed of, for example, $n^+$InGaAs with a thickness less than or equal to 15 nm.

The channel layer 13 may have InGaAs/InAs channels including a first channel 131, a sub-channel 132, and a second channel 133. For example, the first channel 131 may be formed of $In_{0.53}$GaAs with a thickness less than or equal to 5 nm, the sub-channel 132 may be formed of InAs with a thickness less than or equal to 3 nm, and the second channel 133 may be formed of $In_{0.75}$GaAs with a thickness less than or equal to 7 nm. As the heterojunction structure for providing an electron cloud, not only the proposed InGaAs/InAs channels but also heterojunction structures of AlGaN/GaN, InAlN/AlN/GaN, AlGaAs/GaAs and AlGaAs/InGaAs may be used.

The buffer layer 12, the spacer 14, the etch stop layer 18, and the cap layers 19 and 20, which are not essential elements but preferred elements, may be eliminated according to a request for a specific configuration. To obtain high efficiency, however, it is desired that these elements are provided.

The gate 6 is provided in the area of a gate recess 8, which is provided by etching the cap layers and/or the etch stop layer 18. The gate 6 has a multilayer structure of Ti/Pt/Au or Pt/Ti/Pt/Au and may make a Schottky contact with the Schottky layer 17. The source 5 and the drain 7 may have a multilayer structure of AuGe/Ni/Au and the constituents of the structure may make an ohmic contact.

Hereinafter, description will be given of determination of a terahertz frequency in the HEMT 1 and factors for achieving maximum efficiency.

In the HEMT 1, the gate 6 is shorted to the source 5 in terms of DC and AC. Accordingly, the heterojunction structure of the HEMT is preferably designed such that transconductance $(gm=\partial Id/\partial Vg)$ is maximized when the gate-source voltage is 0 V. When the transconductance is maximized, adjustment of concentration of a two-dimensional electron cloud in the channel may be most easily adjusted with a gate voltage, and accordingly the amplitude of a plasma wave according to change in concentration of the two-dimensional electron cloud is maximized.

When the gate bias voltage is zero, maximization of transconductance depends on various parameters of the device. Among the parameters, the most influential parameters are concentration of the two-dimensional electron cloud and the distance between the gate and the channel. The distance between the gate and the channel may be determined by the sum of the thickness of the Schottky layer 17 and the thickness of the spacer layer 14. For example, in the HEMT based on InP, when the sheet charge density of the two-dimensional electron cloud formed in the channel is about $2.5\times10^{12}/cm^2$, the distance between the gate and the channel may be determined to be between 5 nm and 10 nm. The metal material of the gate may also affect the distance. As the height of a barrier of a Schottky diode formed by the gate metal and the Schottky layer 17 increases, the distance between the gate and the channel may increase. By increasing the distance between the gate and the channel, a current leaking toward the gate may be reduced. For example, for a gate employing Pt with a thickness between 5 nm and 8 nm as the lowest layer (e.g., a multilayer structure of Pt/Ti/Pt/Au), $PtAs_2$ may be formed through reaction between Pt and the Schottky layer 17 in thermal treatment after the gate formation operation. The metallic-phase material ($PtAs_2$) has an effect of increasing the Schottky barrier height. The material also has an effect of reducing the effective distance between the gate and the channel. The thicknesses of the Schottky layer 17 and the spacer layer 14 obtained through growth of the heterojunction structure may be increased in a structure having the same sheet barrier density through the operation described above. Thereby, the operation contributes to stability of the device. In this case, the increased thickness of the Schottky layer 17 may contribute to enhancement of electron mobility of the two-dimensional electron cloud formed in the channel.

The oscillation frequency of the plasma wave may depend on the gate length Lg and the gate recess length Lr. The distance Lc between the cap layers may be given as Lc=Lg+2Lr.

If the drain voltage is low and thus the HEMT device operates in the linear mode, the distance Lc between the cap layers creates a resonator generating oscillation of a plasma wave. In this case, the oscillation frequency fo is approximately determined as fo=s/(4*Lc). Herein, s denotes the travel speed of the plasma wave, and may be expressed as s=sqrt(q*$U_0$/m). Herein, q, which has an absolute value, denotes charge of the electron, $U_0$ has a value obtained by subtracting a threshold voltage from the gate voltage, and m denotes effective mass. If the drain voltage is sufficiently high and thus the HEMT device operates in the saturation mode, the sum of the gate recess length Lr and the gate length Lg, i.e., Lc2=Lg+Lr forms a resonator corresponding to ¼ of the resonance plasma wave length. In this case, the oscillation frequency is approximately determined as fo=s/(4*Lc2). The oscillation frequency may have an error of about 10%, which results from non-uniformity of the density of the electron cloud in the channel according to the voltage applied to the gate and the drain.

Figure 5:
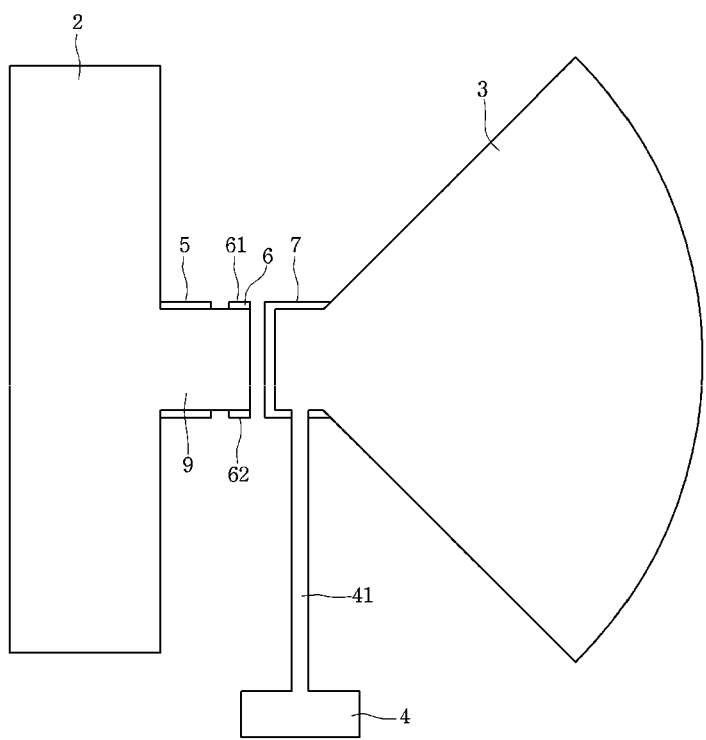
FIG. 5 is a plan view illustrating the terahertz radiating device according to the first embodiment.

FIG. 5 is a plan view illustrating the terahertz radiating device according to the first embodiment.

FIG. 5 shows the monopole antenna 3 for implementing terahertz radiation and the bias 4 for applying a DC voltage to the monopole antenna 3.

The monopole antenna 3, which is a device to radiate a drain current oscillating in the terahertz band to free space, may be connected to the drain 7. The length of the monopole antenna may be determined such that the length corresponds to ¼ of the effective wavelength $\lambda_{eff}$ of a terahertz wave, namely $\lambda_{eff}/4$. Herein, the effective wavelength of the terahertz wave is affected by the effective dielectric constant $\epsilon_{eff}$ of the substrate. When the wavelength of terahertz wave in free space is 1, the effective wavelength $\lambda_{eff}$ on the substrate may be determined as $\lambda/\sqrt{\epsilon_{eff}}$.

The structure of the monopole antenna 3 may depend on the frequency bandwidth of the radiated terahertz wave. Preferably, the monopole antenna 3 has a radial stub shape as shown in the figure because this shape allows the terahertz wave to be radiated in a wider terahertz frequency band. However, the antenna may alternatively have a straight-line shape. Specifically, for a monopole antenna having a radial stub structure, impedance changes smoothly at frequencies around a resonance frequency, and thus impedance matching may be facilitated in a wide frequency region. The monopole antenna 3 is symmetrically formed with respect to the travel direction of the plasma wave. Thereby, stabilized terahertz electromagnetic waves may be provided.

Preferably, high impedance is provided through an electrode for applying a DC voltage to the drain 7 to prevent performance of the monopole antenna 3 from affecting the electrode. To this end, a high impedance line 41 may be provided as a waveguide which is formed of metal and very narrow compared to the monopole antenna 3. The high impedance line 31 may be positioned very close to the drain 7. The high impedance line 41 may prevent a surface current of a terahertz band flowing on the monopole antenna 3 from flowing along a wire for applying a bias voltage. In addition, the high impedance line 41 may be arranged in a direction perpendicular to the travel direction of the plasma wave such that any possible polarized wave of parasitic radiation becomes orthogonal to a terahertz wave radiating from the monopole antenna.

The length of the high impedance line for connecting the monopole antenna 3 and the drain for applying drain bias may be $\lambda_{eff}/4$ as determined above. As the high impedance line has a length of $\lambda_{eff}/4$, an AC open circuit is formed at a point where the antenna having a phase difference of 90 degrees from the drain which is AC-shorted meets the high impedance line. Thereby, influence on the boundary condition for terahertz radiation may be minimized.

When viewed from the gate 6, the source-gate connector 9 extends in a direction (horizontal direction in the figure) perpendicular to the longitudinal direction (vertical direction in the figure) of the gate 6. In other words, in order to enhance efficiency of voltage application, the source-gate connector 9 is preferably connected to the overall region of the gate and to the source 5 at the shortest distance with respect to the gate, which extends in one direction and has both ends provided with a gate foot 61 and a gate head 62.

Figure 6:
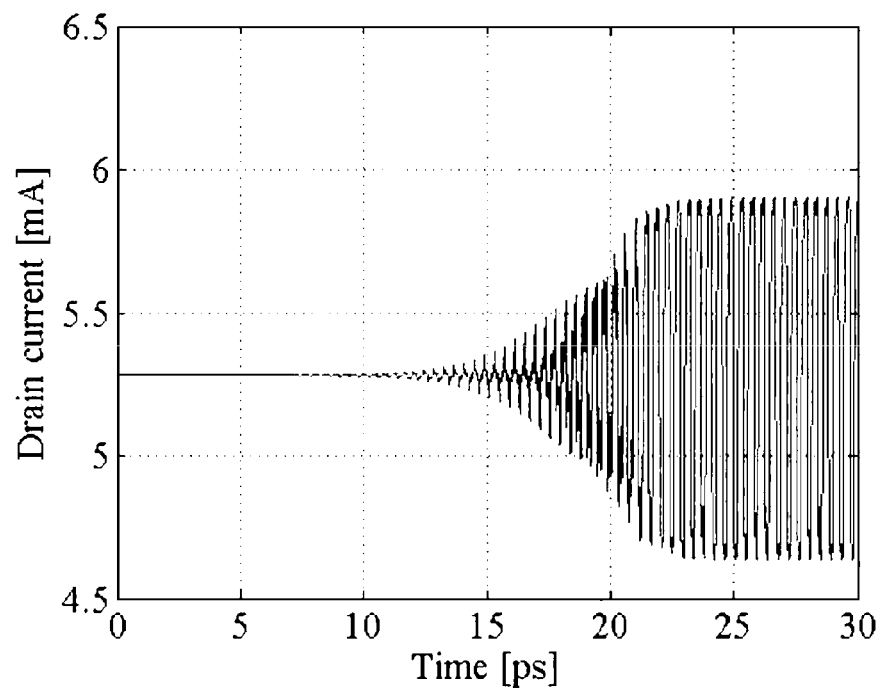
FIG. 6 is a graph depicting a result of simulation of the terahertz radiating device according to the first embodiment.

FIG. 6 is a graph depicting a result of simulation of the terahertz radiating device according to the first embodiment. It can be seen from FIG. 6 that a drain current oscillates after a certain time passes. Accordingly, it can be seen from the simulation that power transport through the drain is possible.

The simulation has been performed for a channel arranged under the gate of the HEMT. Specifically, in order to show movement of an electron in the channel, a solution satisfying the Poisson equation and equations for electron transport including a continuity equation of electron concentration and an equation for current density together has been obtained through numerical analysis.

The initial state for the simulation is obtained through DC analysis. A small gate voltage of about 1 V has been applied to the obtained initial state, and then changes in physical quantities over time have been observed. Regarding the boundary condition, a certain voltage has been applied to the source and the gate using an ideal voltage source, and finite resistance has been applied to the drain. Since the resistance to the drain has a finite value, flow of the drain current is allowed.

The parameters of the adopted device and material are as follows. The length of the channel is 60 nm, the width of the channel is 50 μm, and concentration of the two-dimensional electron gas in the channel is $3.3 \times 10^{11}/cm^2$. A momentum relaxation time taken for an electron to lose the speed thereof through collision is 0.33 psec, the moving speed of the electron is $2 \times 10^7$ cm/sec, and resistance applied to the drain is 50Ω.

According to the result of the experiment, small fluctuation of the gate voltage is amplified by instability of plasma in the channel, thereby oscillating a large drain current.

Figure 7:
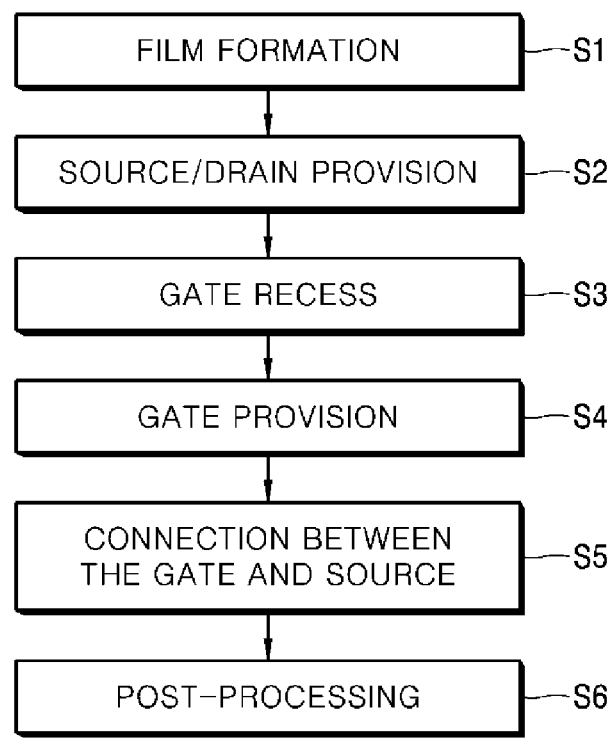
FIG. 7 illustrates a method for fabricating the terahertz radiating device according to the first embodiment.

FIG. 7 illustrates a method for fabricating the terahertz radiating device according to the first embodiment.

Referring to FIG. 7, the method for fabricating the terahertz radiating device according to the first embodiment may include a film forming operation S1, a source/drain providing operation S2, a gate recess operation S3, a gate providing operation S4, an operation of connecting the gate and the source S5, and a post-processing operation S6.

Hereinafter, the operations will be described respectively in detail.

First, the film forming operation S1 may involve the substrate 11, the buffer layer 12, the channel layer 13, the spacer 14, the delta-doped layer 15, the Schottky layer 17, the etch stop layer 18, the first cap layer 19, and the second cap layer 20. Herein, the buffer layer 12, the spacer 14, the etch stop layer 18, and the cap layers 19 and 20 are not essential elements but preferably provided in consideration of intended operations and effects. The channel layer 13 may include a first channel 131, a sub-channel 132, and a second channel 133. Configurations and materials of the respective layers may be the same as described above with reference to FIG. 3.

In the source/drain providing operation S2, an ohmic contact material may be grown in, for example, a multilayer structure of AuGe/Ni/Au at proper positions to form a source and a drain, and ohmic contact performance may be improved through thermal treatment at a temperature between 250° C. and 350° C. If InAlN/GaN, InGaAlN/GaN, or AlGaN/GaN is used for the heterojunction structure in place of InGaAs/InAs, an ohmic contact material may be deposited to have, for example, a multilayer structure of Ti/Al/Ni/Au or Mo/Al/Mo/Au, and then ohmic contact may be made through thermal treatment at a temperature between 600° C. and 950° C.

The gate recess operation S3 may be defined as a process of etching the first and second cap layers 19 and 20 such that the metal forming the gate makes a Schottky contact. The etch stop layer 18 may also be etched in the gate recess operation S3. If the metal forming the gate is deposited on the etch stop layer 18, the gate may be thermally treated at a temperature between 270° C. and 350° C.

In this case, if InAlN/GaN, InGaAlN/GaN, or AlGaN/GaN is used for the heterojunction structure in place of InGaAs/InAs, the gate recess operation S3 for providing the gate may not be performed. However, the gate recess operation may be performed in order to maximize transconductance when the gate voltage becomes zero by shifting the threshold voltage in a positive direction. In this case, the etch depth of the recess may be adjusted such that the thickness of the InAlN or InGaAlN layer becomes between 3 nm to 4 nm, and the final thickness of the AlGaN layer becomes less than or equal to 10 nm.

In the gate providing operation S4, Ti/Pt/Au or Pt/Ti/Pt/Au multilayer metals may be deposited at a proper position to form the gate.

The operation of connecting the gate and the source S5 may be performed by connecting the source 5 and the gate 6 with a conductive material, for example, a metal material. This operation may be a feature of this embodiment. This operation may be intended to allow an HEMT to operate as a terahertz radiating device. The source-gate connector 9 may be provided along with the ground 2.

Thereafter, the post-processing operation S6 including circuit connection and installation may be performed.

According to the first embodiment described above, a terahertz radiating device which has a compact and lightweight design, is operable through oscillation with low power at room temperature, and can be electrically controlled by adjusting an externally applied voltage may be implemented as the HEMT. Particularly, a terahertz radiating device producing a high output power and serving to a commercial purpose may be implemented.

<Embodiment 2>

All elements of the second embodiment except for some elements are identical to those of the first embodiment. Accordingly, only elements which are not included in the first embodiment will be described. For the elements of the second embodiment identical to those of the first embodiment, descriptions given in the first embodiment are applied.

Figure 8:
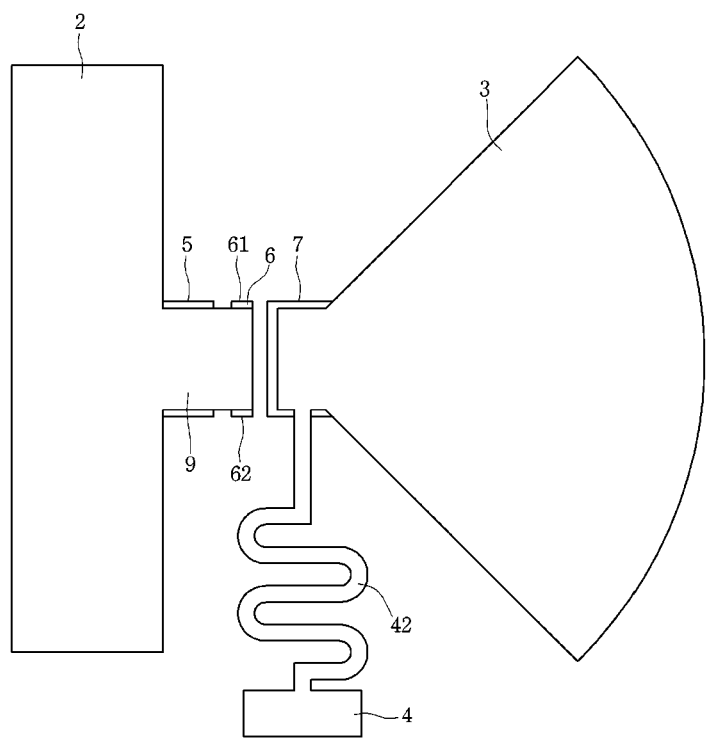
FIG. 8 is a plan view illustrating a terahertz radiating device according to a second embodiment.

FIG. 8 is a plan view illustrating a terahertz radiating device according to a second embodiment.

Referring to FIG. 8, a waveguide provided to the bias 4 may be formed in the shape of a curved line 42, for example, a meander line, rather than a straight line. Thereby, the waveguide may extend in a direction perpendicular to the travel direction of a plasma wave, thereby not only eliminating influence of parasitic radiation but also reducing the size of a circuit provide to the radiating device and increasing self inductance. Thereby, high impedance may be provided.

<Embodiment 3>

All elements of the third embodiment except for some elements are identical to those of the first embodiment. Accordingly, only elements which are not included in the first embodiment will be described. For the elements of the third embodiment identical to those of the first embodiment, descriptions given in the first embodiment are applied.

Figure 9:
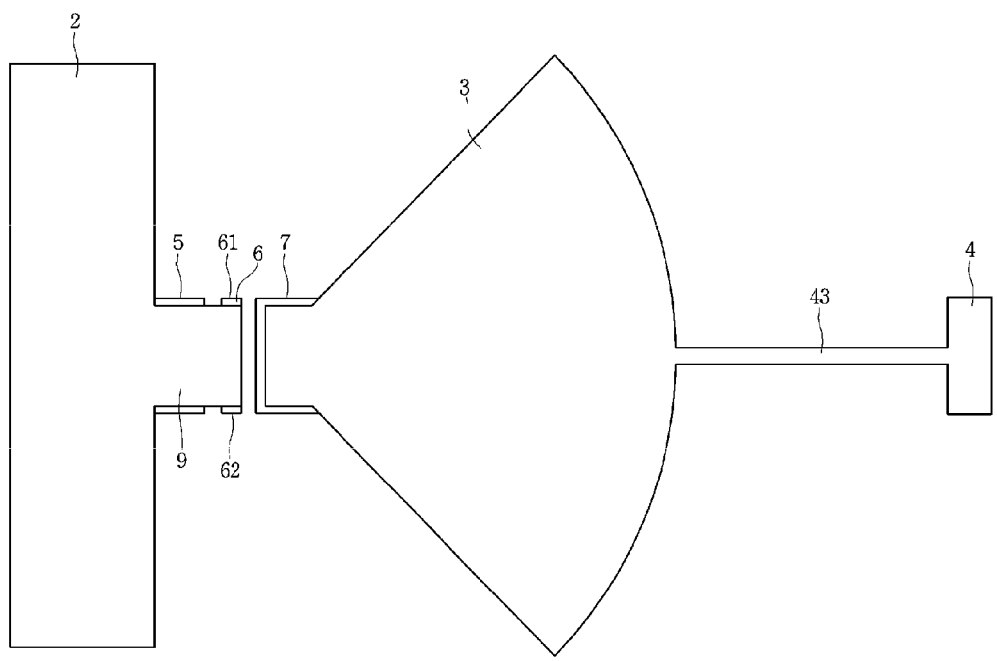
FIG. 9 is a plan view illustrating a terahertz radiating device according to a third embodiment.

FIG. 9 is a plan view illustrating a terahertz radiating device according to a third embodiment.

Referring to FIG. 9, the bias 4 for applying a DC voltage is connected to the center of an end of the monopole antenna 3. With this configuration, the surface current may be minimized, and accordingly influence of the bias 4 on the radiation pattern may be minimized. In addition, since the bias 4 is positioned at the center of the radial stub, the radiation pattern may be symmetrically provided.

<Embodiment 4>

All elements of the fourth embodiment except for some elements are identical to those of the first and third embodiments. Accordingly, only elements which are not included in either the first embodiment or the third embodiment will be described. For the elements of the fourth embodiment identical to those of the first and third embodiments, corresponding descriptions given above are applied.

Figure 10:
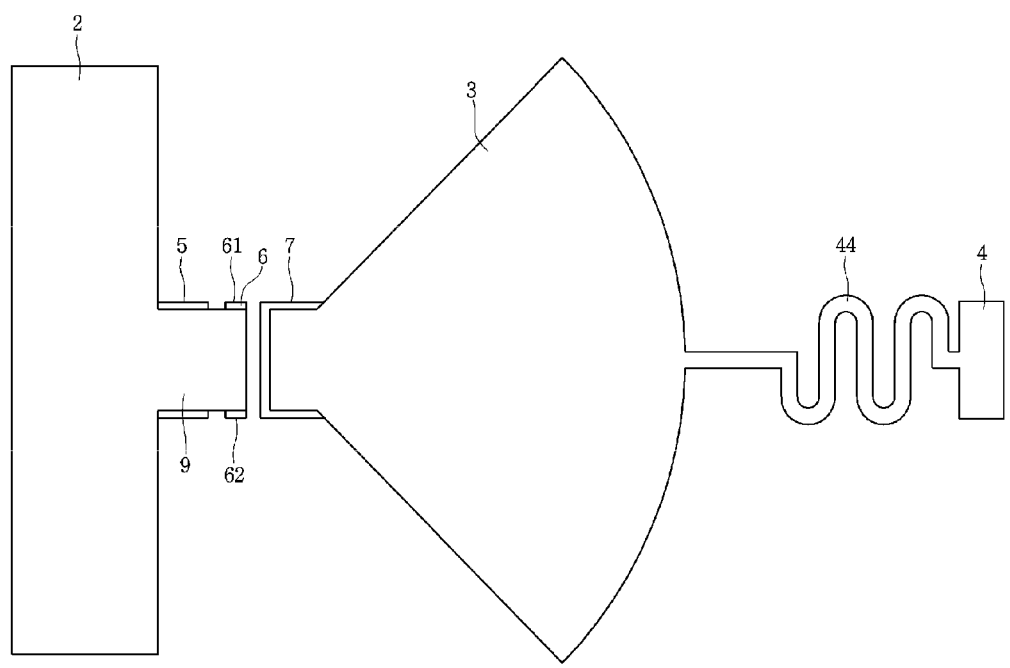
FIG. 10 is a plan view illustrating a terahertz radiating device according to a fourth embodiment.

FIG. 10 is a plan view illustrating a terahertz radiating device according to a fourth embodiment.

Referring to FIG. 10, the bias 4 for applying a DC voltage is positioned at an end of the monopole antenna 3, and is provided with a curved line 44. Thereby, the surface current is minimized, and accordingly influence of the bias 4 on the radiation pattern may be minimized. In addition, since the bias 4 is positioned at the center of the radial stub, the radiation pattern may be symmetrically provided, the size of the circuit or device may be reduced, and a high impedance may be provided.

<Embodiment 5>

All elements of a fifth embodiment except for some elements are identical to those of the first embodiment. Accordingly, only elements which are not included in the first embodiment will be described. For the elements of the fifth embodiment identical to those of the first embodiment, descriptions given in the first embodiment are applied.

Figure 11:
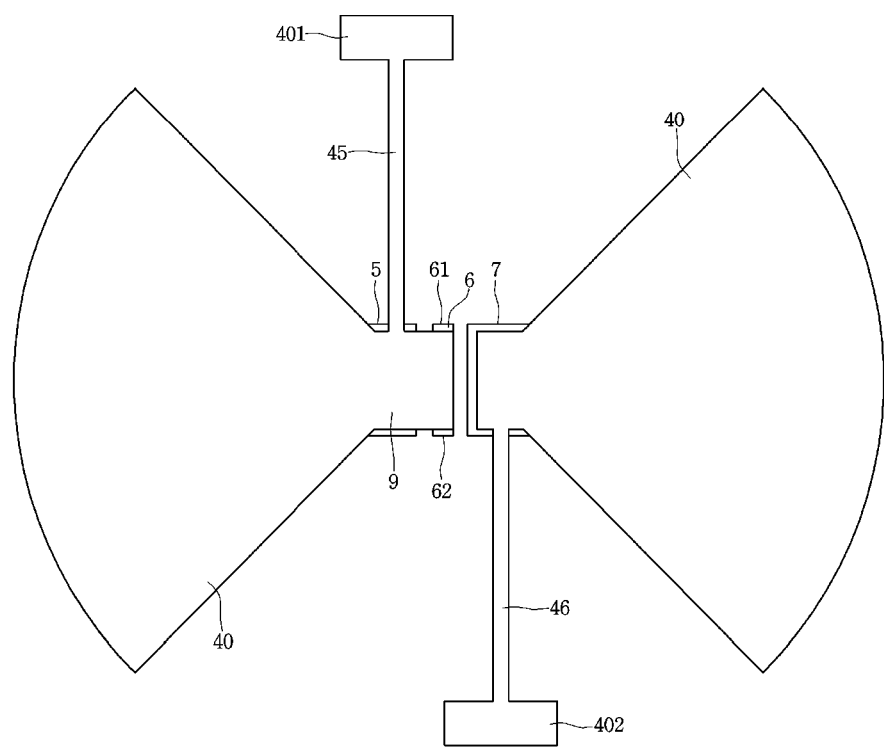
FIG. 11 is a plan view illustrating a terahertz radiating device according to a fifth embodiment.

FIG. 11 is a plan view illustrating a terahertz radiating device according to a fifth embodiment.

Referring to FIG. 11, another radiation element is provided to the source 5. Thereby, a dipole antenna 40 is configured. In this case, a source bias 401 is provided to the source 5, and a drain bias 402 is provided to the drain 7. In addition, high impedance lines 45 and 46 are provided to the biases 401 and 402, respectively. The high impedance lines operate as described in the first embodiment. In order to minimize the influence of the high impedance lines on the terahertz radiating device, the high impedance line 45 may be installed at a position close to the drain 7. In this case, a terahertz electromagnetic wave of a high output power may be radiated in both directions.

<Embodiment 6>

All elements of a sixth embodiment except for some elements are identical to those of the first embodiment. Accordingly, only elements which are not included in the first embodiment will be described. For the elements of the sixth embodiment identical to those of the first embodiment, descriptions given in the first embodiment are applied.

Figure 12:
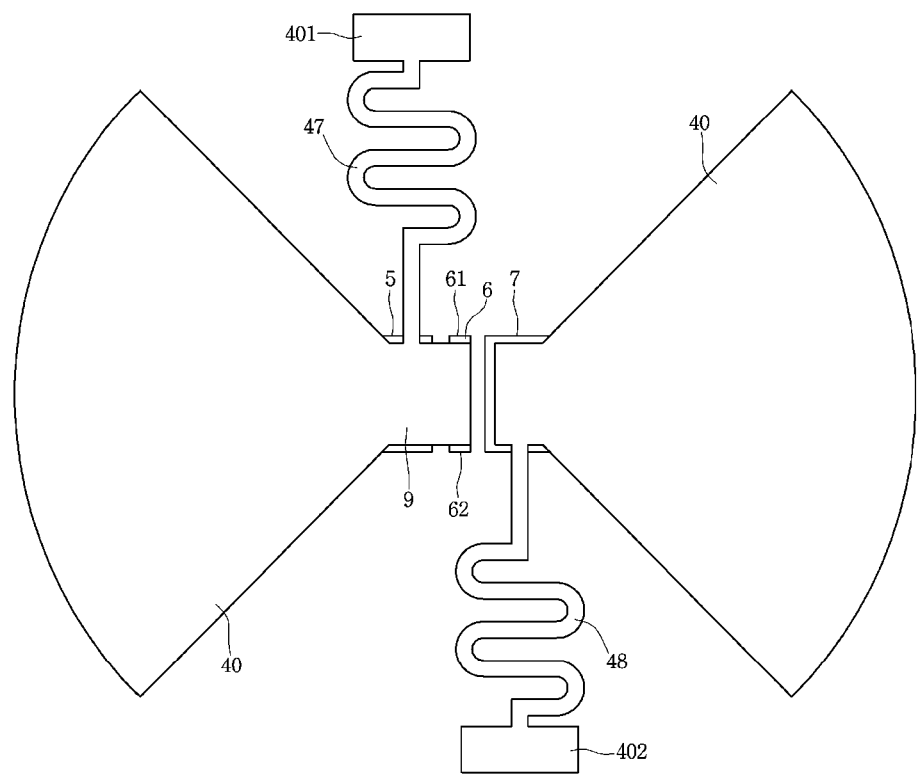
FIG. 12 is a plan view illustrating a terahertz radiating device according to a sixth embodiment.

FIG. 12 is a plan view illustrating a terahertz radiating device according to a sixth embodiment.

Referring to FIG. 12, curved lines 47 and 48 are provided to the biases 401 and 402, respectively. Thereby, the sizes of the circuit and the device may be reduced, and impedance may be increased.

<Embodiment 7>

All elements of a seventh embodiment except for some elements are identical to those of the fifth embodiment. Accordingly, only elements which are not included in the first embodiment will be described. For the elements of the seventh embodiment identical to those of the fifth embodiment, descriptions given in the fifth embodiment are applied.

Figure 13:
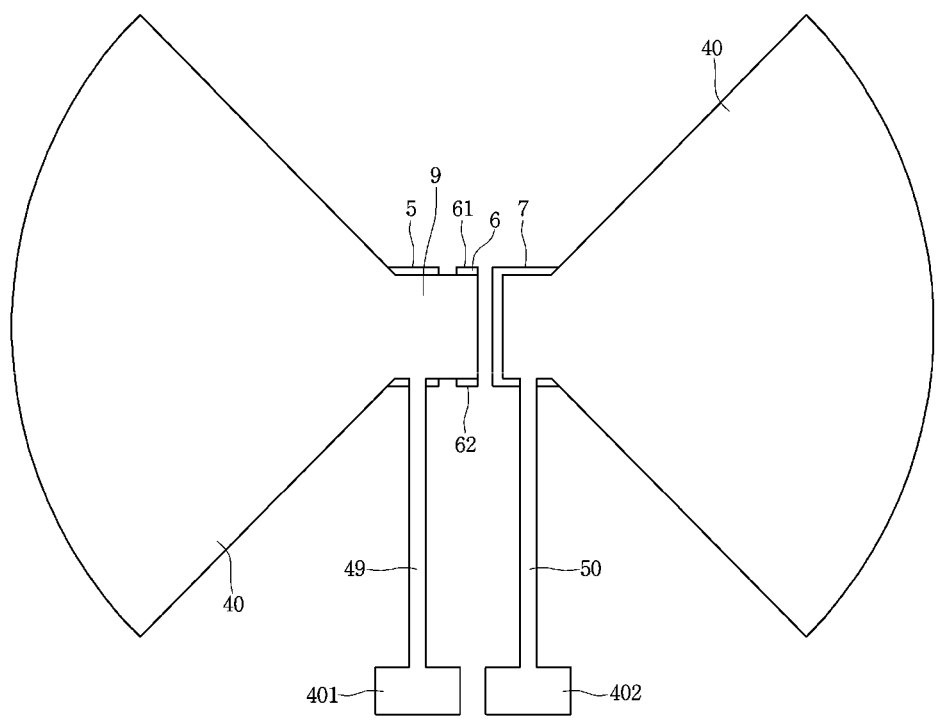
FIG. 13 is a plan view illustrating a terahertz radiating device according to a seventh embodiment.

FIG. 13 is a plan view illustrating a terahertz radiating device according to a seventh embodiment.

Referring to FIG. 13, impedance lines 49 and 50 are provided to the biases 401 and 402, respectively. In this embodiment, the impedance lines 49 and 50 are positioned on the same side, for example, on the lower side or upper side. Thereby, the sizes of the circuit and the device may be further reduced.

<Embodiment 8>

All elements of an eighth embodiment except for some elements are identical to those of the seventh embodiment. Accordingly, only elements which are not included in the seventh embodiment will be described. For the elements of the eighth embodiment identical to those of the seventh embodiment, descriptions given in the seventh embodiment are applied.

Figure 14:
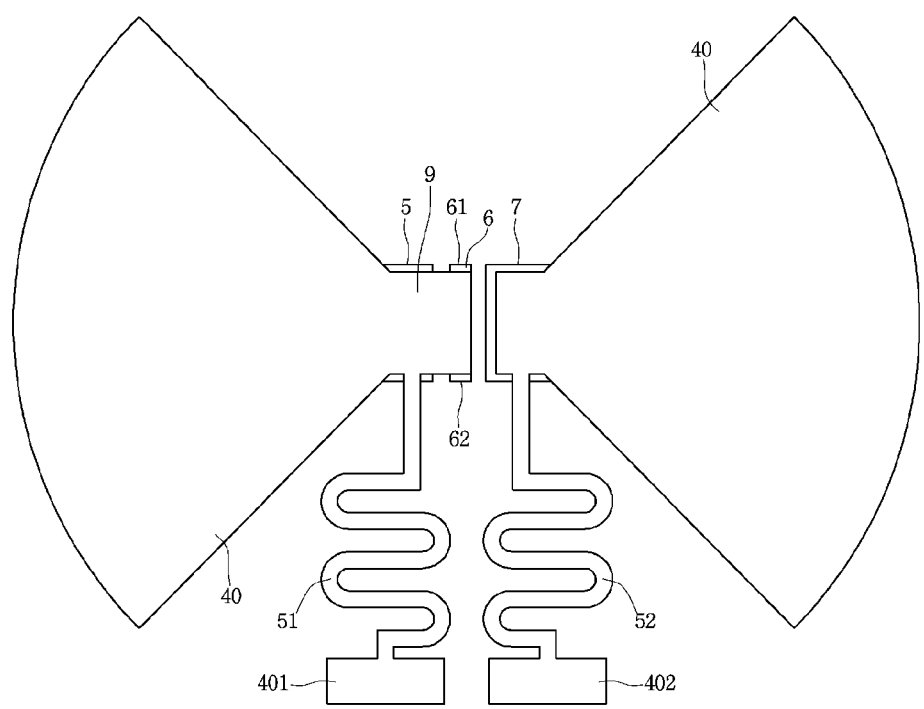
FIG. 14 is a plan view illustrating a terahertz radiating device according to an eighth embodiment.

FIG. 14 is a plan view illustrating a terahertz radiating device according to an eighth embodiment.

Referring to FIG. 14, the biases 401 and 402 are provided with curved lines 51 and 52, respectively. According to this embodiment, the sizes of the circuit and the device may be further reduced.

<Embodiment 9>

Most elements of the fourth embodiment, which has a combination of advantages of the third and fifth embodiments, are identical to those of the first and third embodiments. Accordingly, only elements which are not included in either the third embodiment or the fifth embodiment will be described. For the elements of the ninth embodiment identical to those of the third and fifth embodiments, corresponding descriptions given above are applied.

Figure 15:
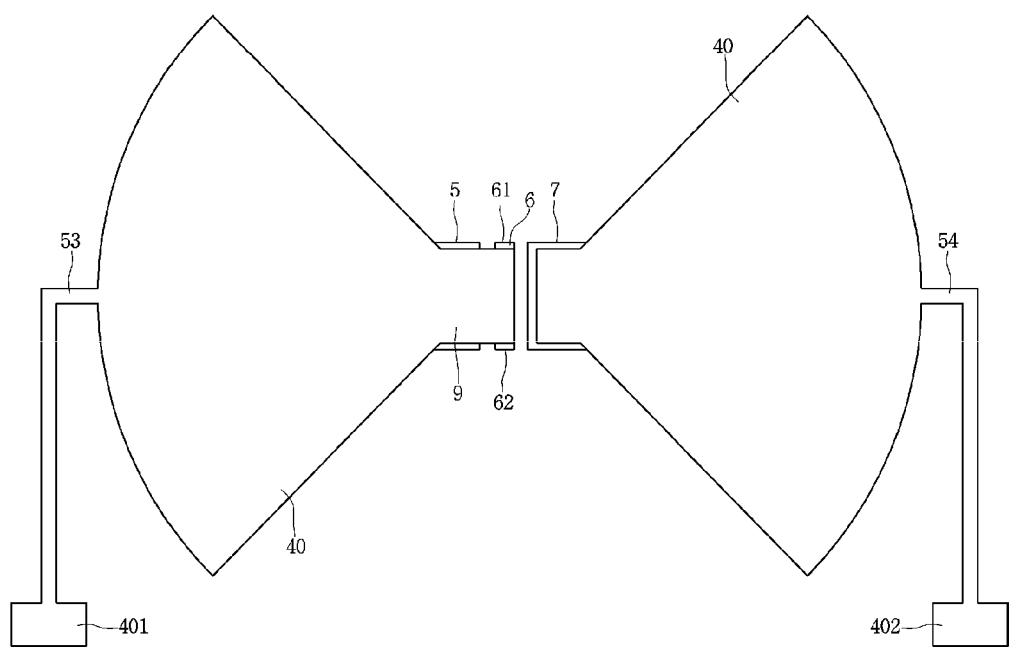
FIG. 15 is a plan view illustrating a terahertz radiating device according to a ninth embodiment.

FIG. 15 is a plan view illustrating a terahertz radiating device according to a ninth embodiment.

Referring to FIG. 15, biases 401 and 402 for applying a DC voltage are connected to ends of a dipole antenna 3, and high impedance lines 53 and 54 are curved. According to this embodiment, the surface current is minimized, and therefore influence of the biases on the radiation pattern may be minimized. In addition, since the biases are positioned at the center of the radial stub, the radiation pattern may be symmetrically provided. Moreover, a terahertz electromagnetic wave of high output power may be radiated in both directions. Further, as the high impedance lines are provided in a curved form, the sizes of the circuit and the device may be reduced.

<Embodiment 10>

All elements of a tenth embodiment except for some elements are identical to those of the ninth embodiment. Accordingly, only elements which are not included in the ninth embodiment will be described. For the elements of the tenth embodiment identical to those of the ninth embodiment, descriptions given in the ninth embodiment are applied.

Figure 16:
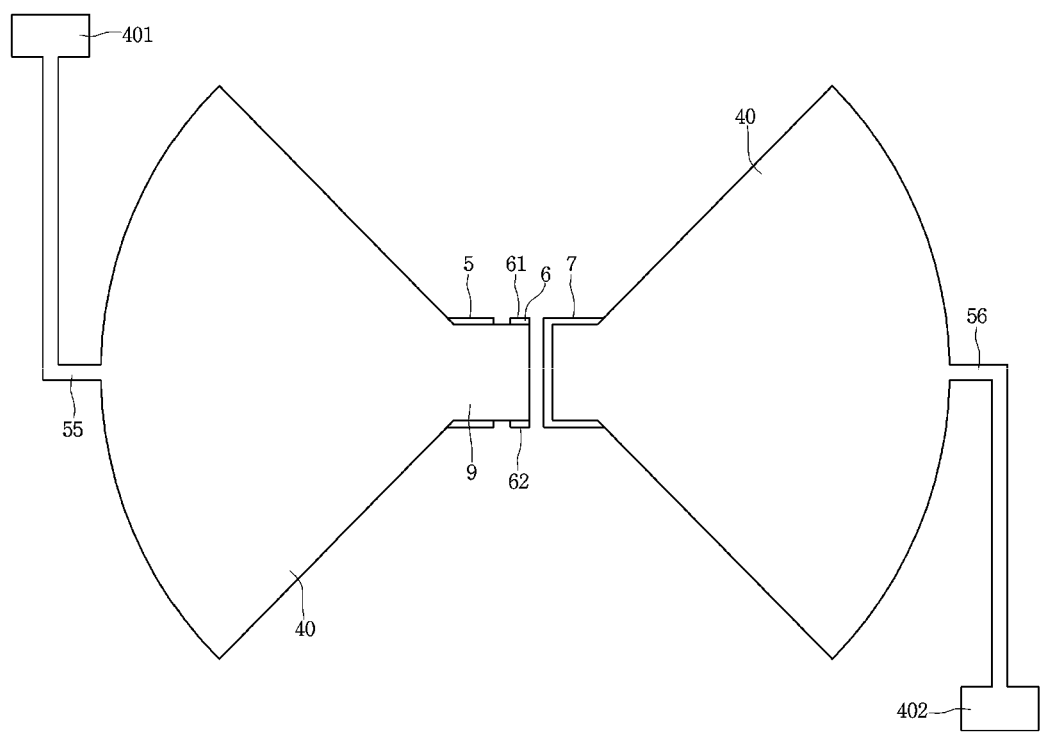
FIG. 16 is a plan view illustrating a terahertz radiating device according to a tenth embodiment.

FIG. 16 is a plan view illustrating a terahertz radiating device according to a tenth embodiment.

Referring to FIG. 16, curved biases 401 and 402 for applying a DC voltage are connected to ends of a dipole antenna 3, and the directions in which the high impedance lines 55 and 56 are curved are opposite to each other. According to this embodiment, the radiation parent may be further symmetrically provided.

<Embodiment 11>

All elements of an eleventh embodiment except for some elements are identical to those of the ninth embodiment. Accordingly, only elements which are not included in the ninth embodiment will be described. For the elements of the eleventh embodiment identical to those of the ninth embodiment, descriptions given in the ninth embodiment are applied.

Figure 17:
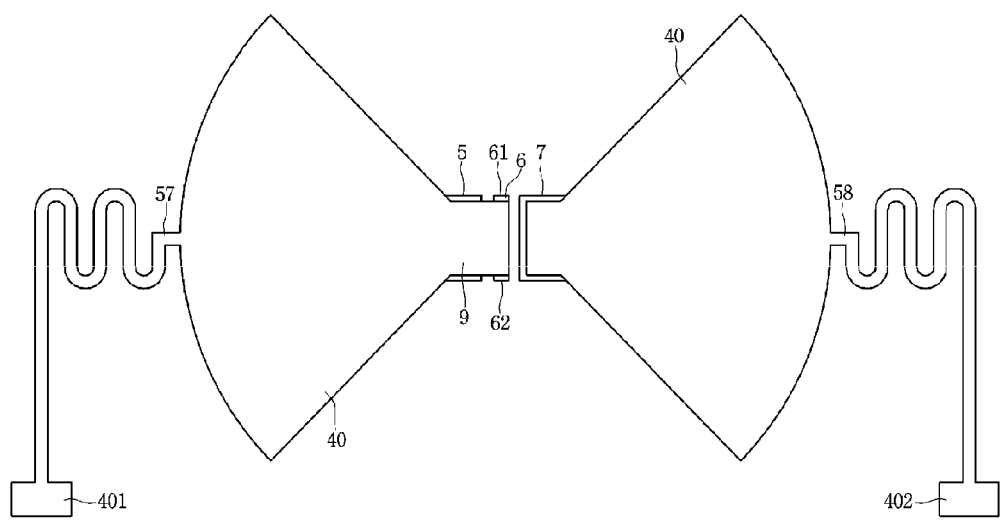
FIG. 17 is a plan view illustrating a terahertz radiating device according to an eleventh embodiment.

FIG. 17 is a plan view illustrating a terahertz radiating device according to an eleventh embodiment.

Referring to FIG. 17, curved biases 401 and 402 for applying a DC voltage are connected to ends of a dipole antenna 3, and curved lines 51 and 52 are provided to the biases 401 and 402, respectively. According to this embodiment, the sizes of the circuit and the device may be further reduced.

<Embodiment 12>

All elements of a twelfth embodiment except for some elements are identical to those of the first embodiment. Accordingly, only elements which are not included in the first embodiment will be described. For the elements of the twelfth embodiment identical to those of the first embodiment, descriptions given in the first embodiment are applied.

Figure 18:
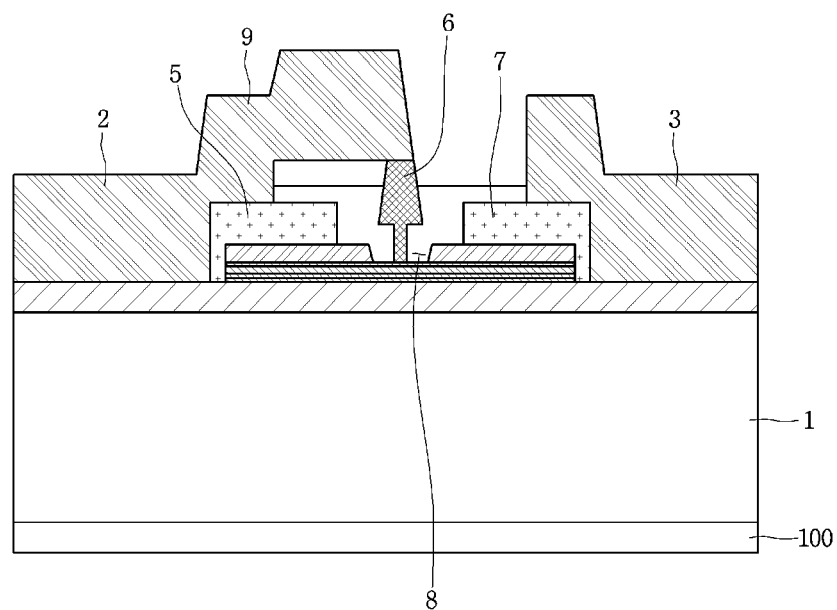
FIG. 18 is a plan view illustrating a terahertz radiating device according to a twelfth embodiment.

FIG. 18 is a plan view illustrating a terahertz radiating device according to a twelfth embodiment.

Referring to FIG. 18, the metal layer 100 is laminated on the lower side of the substrate 11. The metal layer 100 facilitates heat dissipation to prevent heat from deteriorating the device and serves as a reflector of the antenna. Thereby, the metal layer may serve to increase output power and to adjust directionality of a radiated terahertz wave and also serve as an installation surface for facilitating installation of a module on a separate substrate. To make the metal layer function as a reflector, the thickness of the substrate may be determined to be ¼ of the wavelength of a radiated terahertz wave in the substrate.

<Embodiment 13>

All elements of a thirteenth embodiment are identical to those of the first embodiment except for a channel layer. Accordingly, only the different element which is not included in the first embodiment will be described. For the elements of the thirteenth embodiment identical to those of the first embodiment, descriptions given in the first embodiment are applied.

Figure 19:
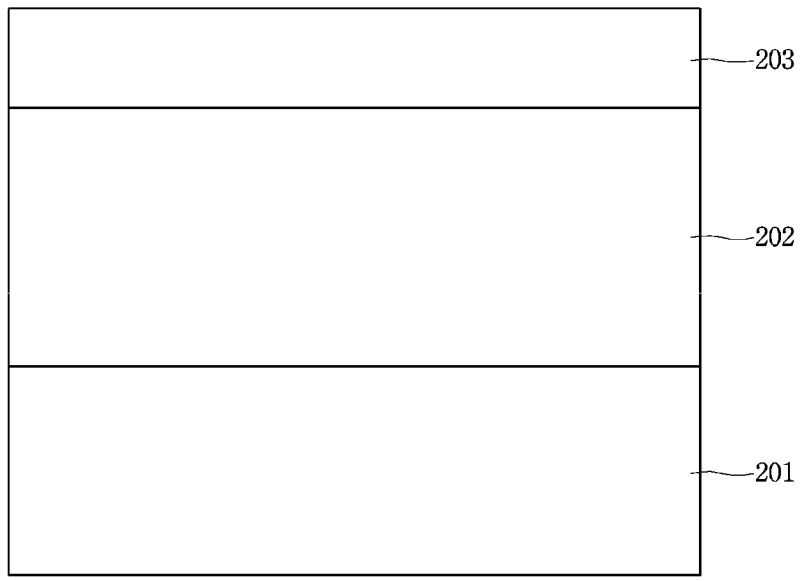
FIG. 19 is a view illustrating a film structure of an HEMT according to a thirteenth embodiment.
Figure 20:
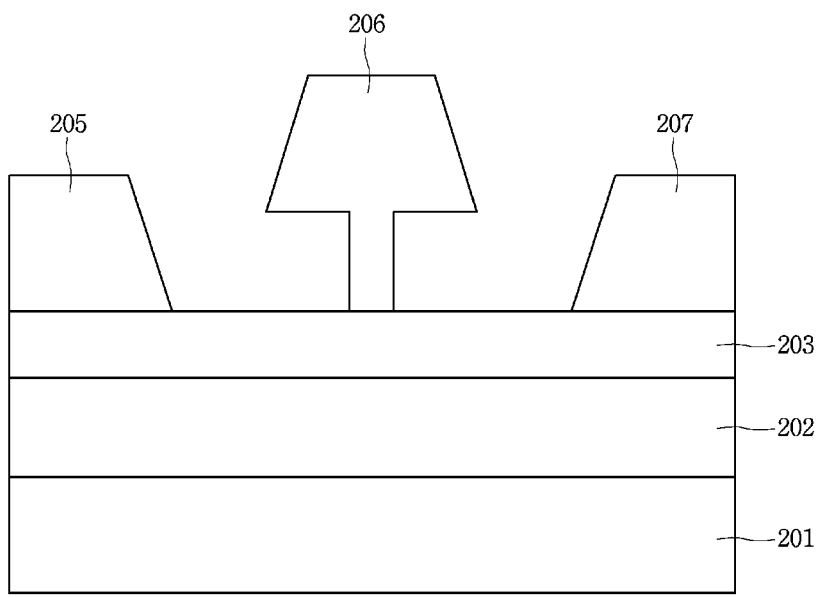
FIG. 20 is a view illustrating an HEMT structure according to the thirteenth embodiment.

FIG. 19 is a view illustrating a film structure of an HEMT according to a thirteenth embodiment, and FIG. 20 is a view illustrating an HEMT structure according to the thirteenth embodiment.

Referring to FIGS. 19 and 20, the HEMT includes a substrate 201 formed of, for example, sapphire or SiC, an i-GaN layer 202 provided on the substrate 201, and a channel layer 203. The channel layer 203, to which GaN is applied, has a heterojunction structure of InAlN/GaN, InGaAlN/GaN or AlGaN/GaN. This embodiment differs from the first embodiment in providing a source 205, a gate 206 and a drain 207.

The source 205 and the drain 207 may be formed by depositing an ohmic contact material in, for example, a multilayer structure of Ti/Al/Ni/Au or Mo/Al/Mo/Au at a proper position and then make an ohmic contact through heat treatment at a temperature between 600° C. and 950° C. For the gate 206, the gate recess operation S3 may not be performed. Instead, the gate 206 may be provided directly on the channel layer.

In this case, the source 205 and the gate 206 may be connected to each other using a conductive material, for example, a metal material.

According to embodiments of the present invention, a commercially available terahertz radiating device of high output power is expected to be provided and applied to various industrial fields employing terahertz waves.

What is claimed is:

1. A terahertz radiating device comprising:
a high electron mobility transistor (HEMT);
a gate over a substrate of the HEMT;
a source and a drain at opposite sides of the gate;
a first antenna connected with the drain;
a drain bias for applying a direct current (DC) voltage to the drain; and
a source-gate connector for connecting the source and the gate in a device unit.

2. The terahertz radiating device according to claim 1, wherein the source-gate connector extends in a direction perpendicular to a longitudinal direction of the gate, the gate extending in one direction.

3. The terahertz radiating device according to claim 1, wherein the gate and the source are connected to each other at a shortest distance by the source-gate the connector.

4. The terahertz radiating device according to claim 1, wherein the gate and the source are alternating current (AC)-shorted by the source-gate connector.

5. The terahertz radiating device according to claim 4, wherein the source-gate connector is formed such that no parasitic component is present between the gate and the source.

6. The terahertz radiating device according to claim 1, wherein the source-gate connector is formed together with a ground.

7. The terahertz radiating device according to claim 1, wherein the HEMT comprises:
a substrate; and
a channel layer provided on a upper side of the substrate, wherein the channel layer has a heterojunction structure formed of a selected one of InGaAs/InAs, AlGaN/GaN, InAlN/AlN/GaN, AlGaAs/GaAs and AlGaAs/InGaAs.

8. The terahertz radiating device according to claim 7, wherein the channel layer comprises:

a first channel formed of $In_{0.53}GaAs_{0.47}$ with a thickness less than or equal 5 nm;
a sub-channel provided on an upper side of the first channel and formed of InAs with a thickness less than or equal to 3 nm; and
a second channel provided on an upper side of the sub-channel and formed of $In_{0.75}Ga_{0.25}As$ with a thickness less than or equal to 7 nm.

9. The terahertz radiating device according to claim 7, further comprising:
a spacer provided on the channel layer;
a delta-doped layer provided on the spacer; and
a Schottky layer provided on an upper side of the delta-doped layer.

10. The terahertz radiating device according to claim 9, further comprising:
an etch stop layer; and
a cap layer,
wherein the etch stop layer and the cap layer are provided on the Schottky layer.

11. The terahertz radiating device according to claim 7, wherein the substrate is formed of a selected one of InP, sapphaire and SiC.

12. The terahertz radiating device according to claim 7, further comprising:
a metal layer provided to a lower surface of the substrate.

13. The terahertz radiating device according to claim 1, further comprising:
a second antenna connected to the source; and
a source bias for applying a DC voltage to the source.

14. The terahertz radiating device according to claim 13, wherein the bias comprises a high impedance line having a high impedance.

15. The terahertz radiating device according to claim 14, wherein the high impedance line is formed in a shape of a line having a narrow width, the line being a straight line or a curved line.

* * * * *